United States Patent [19]

Main

[11] Patent Number: 4,633,195
[45] Date of Patent: Dec. 30, 1986

[54] BALANCED OSCILLATOR WITH CONSTANT EMITTER VOLTAGE LEVEL

[75] Inventor: W. Eric Main, Mesa, Ariz.

[73] Assignee: Motorola, Inc., Schaumburg, Ill.

[21] Appl. No.: 800,231

[22] Filed: Nov. 21, 1985

[51] Int. Cl.$^4$ .................. H03B 5/08; H03C 3/00
[52] U.S. Cl. .................. 331/117 R; 332/16 T
[58] Field of Search ........... 331/117 R, 117 FE, 167, 331/168, 107 R, 108 R, 108 C, 116 R, 116 FE, 116 M, 117 D, 159, 160; 332/9 T, 16 T, 31 T

[56] References Cited

FOREIGN PATENT DOCUMENTS 3326382 1/1985 Fed. Rep. of Germany ...... 331/167

*Primary Examiner*—Eugene R. LaRoche
*Assistant Examiner*—D. Mis
*Attorney, Agent, or Firm*—Michael D. Bingham

[57] ABSTRACT

A balanced LC oscillator for providing differential oscillator output signals includes a pair of transistors the emitters of which are connected to a voltage reference source that provides a fixed voltage thereto. The base electrodes of each transistor is cross coupled to the collector of the other transistor. The LC tank circuit is connected between the collectors of the two transistors and current supply is provided thereto. Although the potential at the bases of the two transistors vary with respect to the oscillator signal appearing thereat, the emitters are held at a fixed potential to eliminate any common mode signal that may otherwise be generated if the potential at the emitters was permitted to vary.

12 Claims, 2 Drawing Figures

BALANCED OSCILLATOR WITH CONSTANT EMITTER VOLTAGE LEVEL

BACKGROUND OF THE INVENTION

The present invention relates to oscillators and, more particularly, to LC balanced oscillators.

Prior art LC balanced oscillators are well known to those skilled in the art wherein the center oscillation frequency is determined by a LC tank circuit. The prior art is replete with systems which utilize such oscillators. For example, FM receivers and television modulators use LC balanced oscillators as the local oscillators. The MC1732, an integrated circuit manufactured by Motorola Inc., is an example of a television video modulator circuit which uses a LC balanced oscillator to generate a video output signal. In this case the LC components are externally coupled to the internal oscillator components. The oscillator drives a balanced multiplier which is used as a mixer or modulator. An advantage of such balanced systems is that the oscillator signal is removed from the multiplier output.

Typically, the oscillator comprises a pair of transistors the emitters of which are commonly connected to a source of constant current. The base electrodes of the two transistors are cross-connected to the collector of the opposite transistor. The collectors are each coupled to a voltage reference source. The LC tank is coupled across the collectors of the two transistors. The output of the oscillator is taken differentially across the bases of the two transistors. A balanced multiplier comprising a pair of transistors having their emitters commonly connected to a source of current is driven by the oscillator with the differential output of the latter being connected across the base electrodes of the two transistors of the multiplier.

Although prior art LC balanced oscillators of the type described above work well they suffer a major problem. Any signal voltage appearing at the commonly connected emitters of the oscillator will appear at the commonly connected emitters of the transistors of the balanced multiplier. This signal will then be converted to a common mode current which flows through the two transistors. Thus, the oscillator signal developed across the tank in the prior art oscillator, assuming equal collector resistors, will produce a full wave rectified signal at twice the oscillator frequency at the emitters of the transistors of both the oscillator and multiplier. This common mode signal is highly undesirable as it can produce distortion in the modulator output signal and can decrease the conversion gain of the system.

Hence, a need exists for an improved LC balanced oscillator which eliminates or severely restricts common mode signal problems associated with some prior art oscillators.

SUMMARY OF THE INVENTION

Accordingly, it is an object of the present invention to provide an improved oscillator.

It is an another object of the present invention to provide an improved LC balanced oscillator.

Yet another object of the present invention is to provide an integrated oscillator circuit to which is coupled an external LC tank circuit and in which the frequency can be changed over a predetermined range by increasing the bias current in the oscillator without requiring an extra output from the integrated circuit.

In accordance with the above and other objects there is provided an oscillator including frequency determining circuitry comprising first and second transistors each having control electrodes cross-connected to second electrodes of the opposite transistor and first electrodes to which a fixed reference potential is applied, the frequency determining circuitry being coupled between the second electrodes and circutry for supplying operating bias current to the transistors.

DETAILED DESCRIPTION OF THE PREFERRED EMBODIMENT

Figure 1:
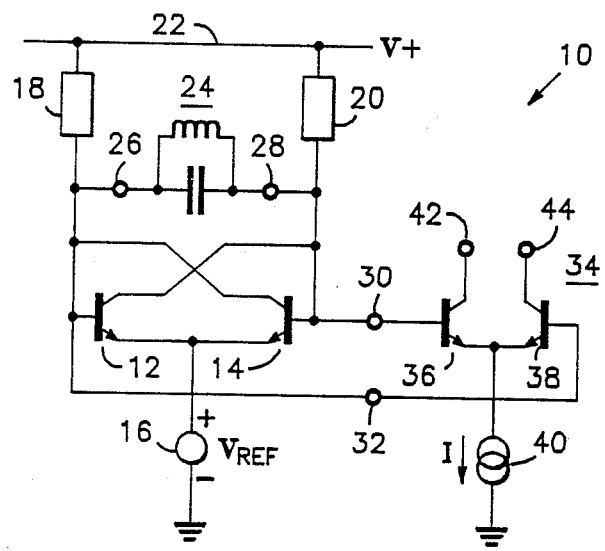
FIG. 1 is a schematic diagram of the oscillator of the present invention.

Referring now to FIG. 1 there is illustrated balanced oscillator 10 of the present invention which is suited to be manufactured in integrated circuit form. Oscillator 10 includes a pair of NPN transistors 12 and 14 the emitters or first electrodes of which are commonly connected to a fixed voltage reference 16 such that the emitter voltage does not vary and is equal to a predetermined voltage equal to $V_{REF}$. The bases or control electrodes of the two transistors are cross-connected to the collector or second electrode of the opposite transistor. The cross connection of the two transistors provides positive feedback as is understood to sustain oscillation. The collectors of the two transistors are coupled in the preferred embodiment to power supply conductor 22 through respective resistors 18 and 20. It is understood however, that resistors 18 and 20 can be replaced, for example, by current sourcing transistors such that a source of operating current is supplied to transistors 12 and 14. A LC tank circuit 24 is connected between the collectors of transistors 12 and 14 at terminals 26 and 28. If oscillator 10 is fabricated in integrated circuit form tank circuit 24 consisting of a discrete coil and capacitor is connected externally to the integrated circuit components. The output of oscillator 10 is taken differentially at outputs 30 and 32.

The general principal of operation of oscillator 10 is well known in that it will operate at the parallel resonant frequency of tank circuit 24. The balanced or differential output of oscillator 10 is used to switch balanced differential amplifier 34 which forms part of a balanced modulator such as described previously relating to the MC1372 video modulator circuit.

Differential amplifier 34 includes transistors 36 and 38 the respective bases of which are connected to the output of oscillator 10. The emitters of transistors 36 and 38 are differentially connected to current source 40. The collectors of transistors 36 and 38 are connected to nodes 42 and 44 which drive the multiplier portion (not shown) of the balanced modulator comprising amplifier 34.

Oscillator 10 of the present invention eliminates the common mode signal as is hereinafter described. Voltage reference 16 maintains the interconnected emitters of transistors 12 and 14 at the fixed voltage of $V_{REF}$ such that even though the oscillator signal causes the voltages at the bases of these transistors to vary the emitters remain at $V_{REF}$. Thus, the voltage level established at the emitters of transistors 36 and 38 remains fixed and the common mode signal problem associated with the aforementioned prior art sustems is eliminated.

Figure 2:
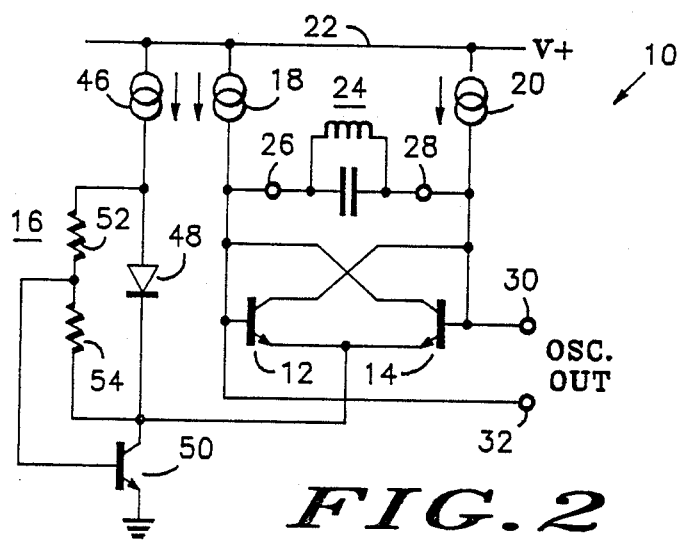
FIG. 2 is a detailed schematic diagram of the preferred embodiment of the invention.

Turning now to FIG. 2 oscillator 10 is illustrated in detail. Current sources 18 and 20 can be realized by current sourcing PNP transistors as is commonly practiced by those skilled in the art. Voltage reference source 16 is shown as comprising a current source 46 coupled between power supply conductor 22 and the anode of diode means 48. It is to be understood that current source 46 can also be realized by a PNP current sourcing transistor. Diode means 48, which may be formed by a diode connected transistor, has its cathode connected to the collector of transistor 50, the emitter of which is returned through a second power supply conductor to ground reference potential. A pair of series-connected resistors 52 and 54 are connected across diode means 48 with the interconnection therebetween being connected to the base of transistor 50. Diode means 48 and resistors 52 and 54 form a voltage reference means for establishing the value of the voltage $V_{REF}$ as will be described.

In operation, current source 46 will supply a current to diode means 48 which also flows through transistor 50. A voltage is therefore established across diode means 48 and series connected resistors 52 and 54. If diode means 48 is formed of an diode-connected transistor the voltage drop across diode means 48 is equal to $V_{BE}$, the base-to-emitter voltage of a standard NPN transistor. The voltage developed at the interconnection of the two resistors can be predetermined by scaling the resistor values. For example, if the resistors are of equal value, the voltage drop across each is $V_{BE}/2$. Thus, transistor 50 establishes the voltage at the interconnection of resistors 52 and 54 to be $V_{BE}$ which due to the $V_{BE/2}$ voltage drop across resistor 54 sets the voltage at the collector of the transistor to a fixed voltage of $V_{BE}/2$. It is understood that the emitters of transistors 12 and 14 can be fixed at ground reference potential in those systems that do not require the oscillator to operate at a fixed voltage above system ground. It is the novel aspect of supplying the emitters of the two transistors of the oscillator with a low impedance fixed voltage reference that distinguishes oscillator 10 over previous systems and eliminates common mode signal injection problems associated therewith.

Although oscillator 10 is illustrated as including a pair of current sources 18 and 20, it is understood that if only one of the current sources is used, the drive to the transistors 12 and 14 will still be differential. Thus, for instance, single current source 18 could be used without current source 20 and vice versa. In addition, it is recognized that emitter follower transistors could be utilized for buffering between the collector of each of the transistors 12 and 14 and the respective base of the opposite transistor to which the collector of the one transistor is cross-connected. Hence, for example, such a buffer transistor would have its emitter connected to the base of transistor 12, its base connected to the collector of transistor 14 and its collector connected to power supply rail 22. Similarly, a second buffer transistor would have its base-emitter path connected between the collector of transistor 12 and the base of transistor 14 and its collector connected to rail 22.

A significant aspect of oscillator 10 is that, if the oscillator is formed within an integrated circuit as previously discussed, the bias currents through transistors 12 and 14 can be varied externally by adjusting V+ which results in the center oscillating frequency being shifted. Prior art balanced LC oscillators similiar to oscillator 10 would require an extra external pin connected to the current source that is connected to the emitters of the two oscillator transistors to control the current of the current source. In many integrated circuits it may not be possible to have such an extra external pinout.

Hence, what has been described is a novel balanced LC oscillator which is used to drive balanced modulators and in which common mode signal injection problems are eliminated.

I claim:

1. A balanced oscillator including frequency determining means connected between first and second terminals, comprising:
   first and second transistors each having first, second and control electrodes, said first electrodes being connected together, said control electrode of said first transistor being coupled both to the first terminal and said second electrode of said second transistor, said control electrode of said second transistor being coupled both to the second terminal and said second electrode of said first transistor;
   current source means for supplying operating current to said first and second transistors; and
   voltage reference means for supplying a predetermined and fixed voltage at said connected first electrodes of said first and second transistors.

2. The oscillator of claim 1 wherein said current source means includes:
   a first current source for supplying current at an output thereof which output is connected to the first terminal; and
   a second current source for supplying current at an output thereof which output is connected to the second terminal.

3. The oscillator of claim 2 wherein said voltage reference means includes:
   a third current source for supplying a current at an output;
   a third transistor having first, second and control electrodes, said first electrode being adapted to receive a ground reference potential; and
   voltage determining means connected to said output of said third current source and said second and control electrodes of said third transistor for establishing said fixed voltage at the second electrode of said third transistor.

4. The oscillator of claim 3 wherein said voltage determining means includes:
   diode means coupled between said output of said third current source and said second electrode of said third transistor; and
   first and second series connected resistors coupled between said output of said third current source and said second electrode of said third transistor, said control electrode of said third transistor being coupled to the interconnection of said first and second resistors.

5. An integrated oscillator having first and second terminals across which a frequency determining circuit is coupled, comprising:
   first and second transistors each having first, second and control electrodes, said first electrodes being connected together, said control electrode of said first transistor being coupled both to the first terminal and said second electrode of said second transistor, said control electrode of said second transistor being coupled both to the second terminal and said second electrode of said first transistor;

current source means for supplying operating current to said first and second transistors; and voltage reference means for supplying a predetermined and fixed voltage at said connected first electrodes of said first and second transistors.

6. The oscillator of claim 5 wherein said current source means includes:
   a first current source for supplying current at an output thereof which output is connected to the first terminal; and
   a second current source for supplying current at an output thereof which output is connected to the second terminal.

7. The oscillator of claim 6 wherein said voltage reference means includes:
   a third current source for supplying a current at an output;
   a third transistor having first, second and control electrodes, said first electrode being adapted to receive a ground reference potential; and
   voltage determining means connected to said output of said third current source and said second and control electrodes of said third transistor for establishing said fixed voltage at the second electrode of said third transistor.

8. The oscillator of claim 7 wherein said voltage determining means includes:
   diode means coupled between said output of said third current source and said second electrode of said third transistor; and
   first and second series connected resistors coupled between said output of said third current source and said second electrode of said third transistor, said control electrode of said third transistor being coupled to the interconnection of said first and second resistors.

9. In a balanced modulator having first and second inputs and including an oscillator providing a differential oscillator signal at the first and second inputs, the improvement comprising said oscillator including;
   first and second transistors each having first, second and control electrodes, said first electrodes being connected together, said control electrode of said first transistor being coupled both to the first terminal and said second electrode of said second transistor, said control electrode of said second transistor being coupled both to the second terminal and said second electrode of said first transistor;
   current source means for supplying operating current to said first and second transistors; and
   voltage reference means for supplying a predetermined and fixed voltage at said connected first electrodes of said first and second transistors.

10. The oscillator of claim 9 wherein said current source means includes:
    a first current source for supplying current at an output thereof which output is connected to the first terminal; and
    a second current source for supplying current at an output thereof which output is connected to the second terminal.

11. The oscillator of claim 10 wherein said voltage reference means includes:
    a third current source for supplying a current at an output;
    a third transistor having first, second and control electrodes, said first electrode being adapted to receive a ground reference potential; and
    voltage determining means connected to said output of said third current source and said second and control electrodes of said third transistor for establishing said fixed voltage at the second electrode of said third transistor.

12. The oscillator of claim 11 wherein said voltage determining means includes:
    diode means coupled between said output of said third current source and said second electrode of said third transistor; and
    first and second series connected resistors coupled between said output of said third current source and said second electrode of said third transistor, said control electrode of said third transistor being coupled to the interconnection of said first and second resistors.

* * * * *